United States Patent
Bhansali et al.

[11] Patent Number: 5,842,626
[45] Date of Patent: Dec. 1, 1998

[54] METHOD FOR COUPLING SURFACE MOUNTED CAPACITORS TO SEMICONDUCTOR PACKAGES

[75] Inventors: Ameet S. Bhansali; Rama K. Shukla, both of Fremont, Calif.

[73] Assignee: Intel Corporation, Santa Clara, Calif.

[21] Appl. No.: 959,292

[22] Filed: Oct. 24, 1997

Related U.S. Application Data

[63] Continuation of Ser. No. 778,058, Jan. 22, 1997, abandoned, which is a continuation of Ser. No. 414,751, Mar. 31, 1995, abandoned.

[51] Int. Cl.$^6$ ................................................. B23K 1/008
[52] U.S. Cl. ................. 228/180.22; 228/219; 228/248.1
[58] Field of Search .............................. 228/180.22, 219, 228/248.1, 123.1, 124.1

[56] References Cited

U.S. PATENT DOCUMENTS

| | | | |
|---|---|---|---|
| 3,609,471 | 9/1971 | Scace | 228/123.1 X |
| 4,113,578 | 9/1978 | Del Monte | 204/192.15 X |
| 4,784,310 | 11/1988 | Metzger et al. | 228/123.1 |
| 5,055,914 | 10/1991 | Shimizu et al. | 257/722 |
| 5,564,617 | 10/1996 | Degani et al. | 228/180.22 |

*Primary Examiner*—Kenneth J. Ramsey
*Attorney, Agent, or Firm*—Blakely, Sokoloff, Taylor & Zafman

[57] ABSTRACT

A low cost method for mechanically and electrically coupling a surface mounted capacitor to a semiconductor package. In one embodiment a metal coating is deposited over the electrodes of a capacitor. Concurrently, or at some other time, solder paste is applied to the electrical contact pads of a semiconductor package. The connection between the capacitor and package is made by positioning the metal coated regions of the capacitor over the electrical contact pads of the package and running the unit through a reflow furnace where the solder paste is wetted onto the metal coating of the capacitor and onto the electrical contact pads of the package.

32 Claims, 4 Drawing Sheets

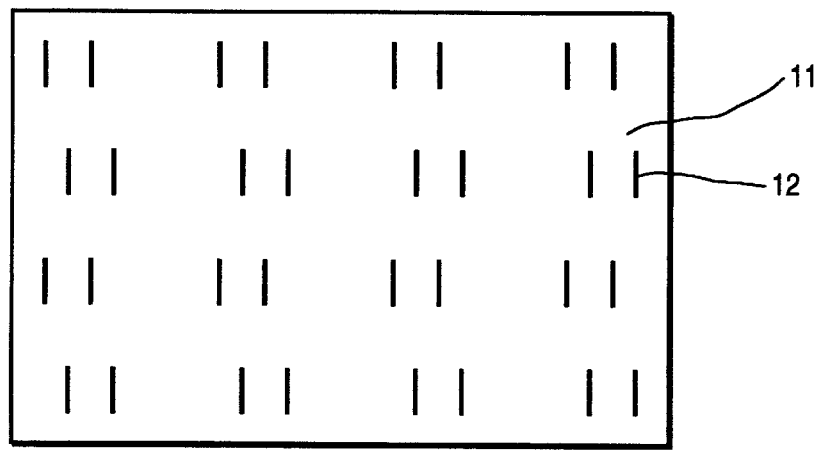
FIG_1
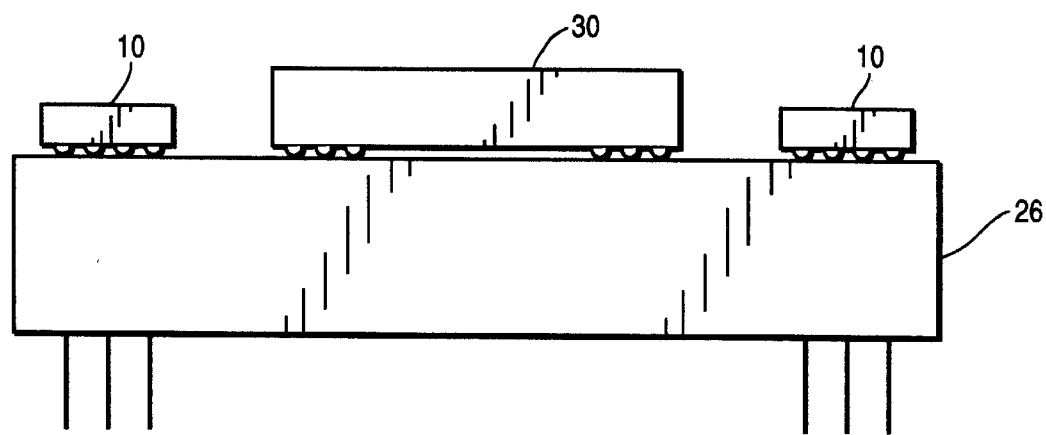
FIG_2

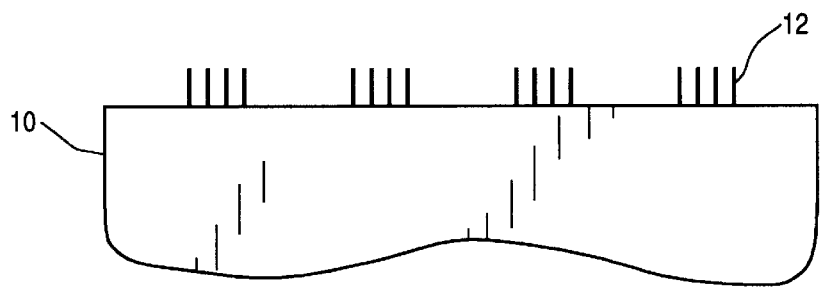
FIG_3
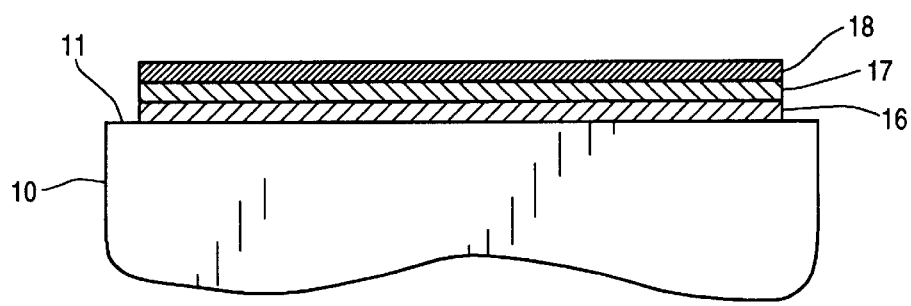
FIG_4
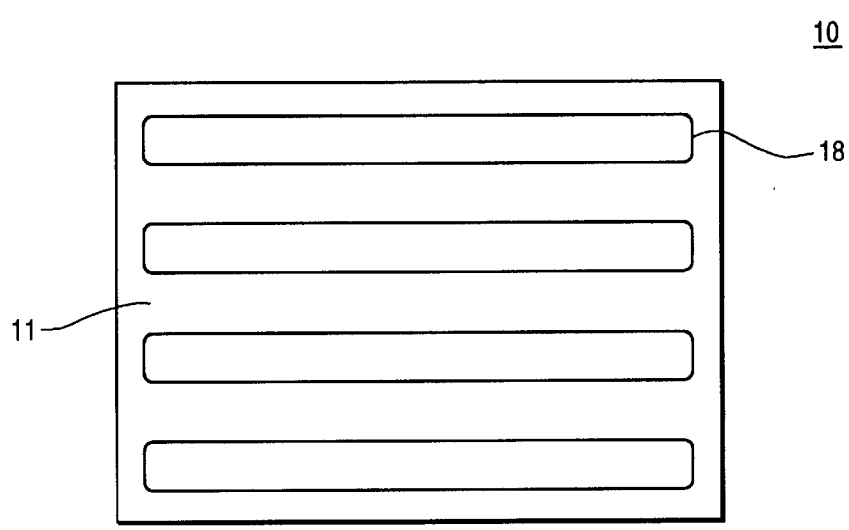
FIG_5

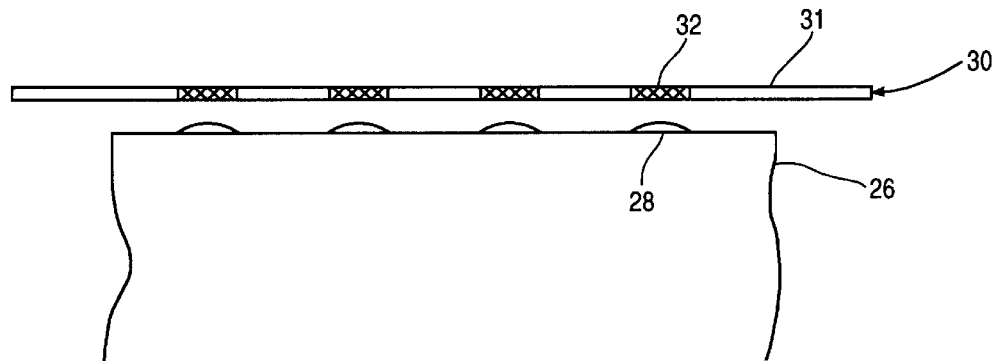
FIG_6
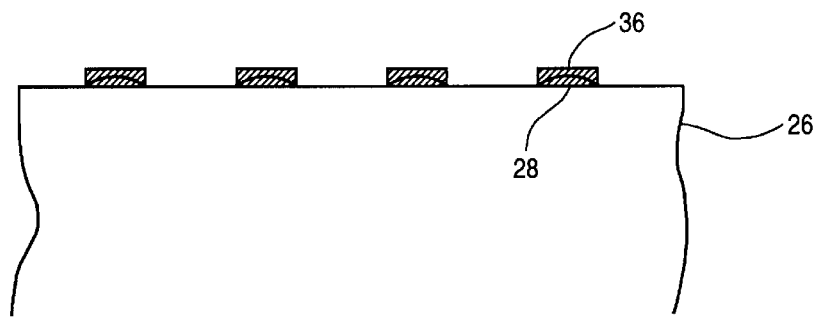
FIG_7
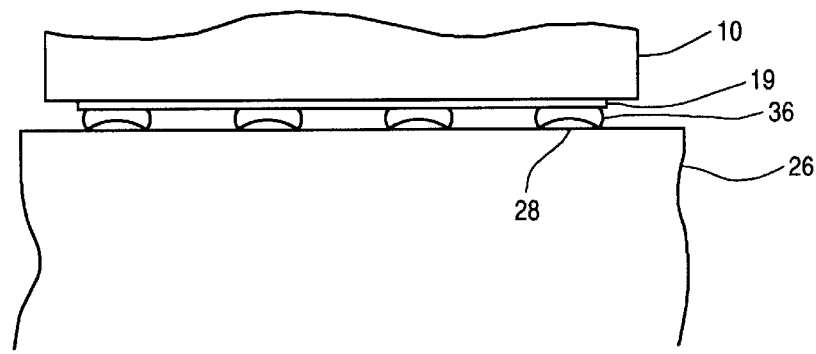
FIG_8

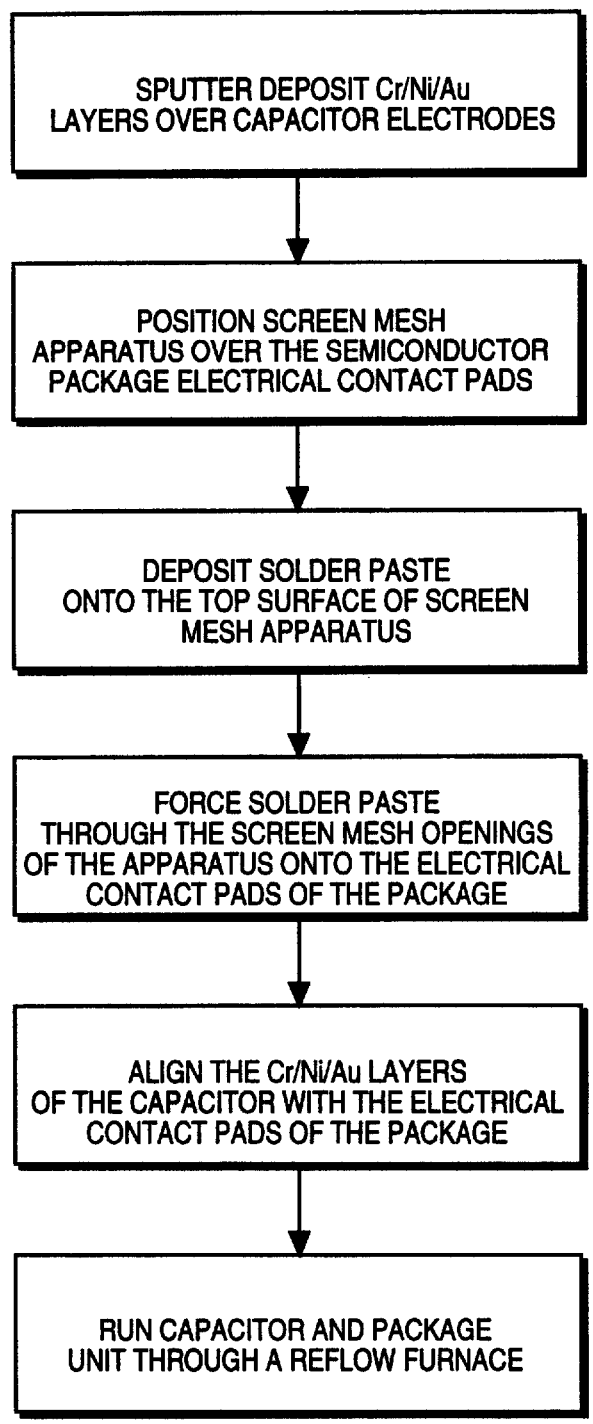
FIG_9

METHOD FOR COUPLING SURFACE MOUNTED CAPACITORS TO SEMICONDUCTOR PACKAGES

This is a continuation of application Ser. No. 08/778,058, filed Jan. 22,1997, now abandoned A, which is a continuation of application Ser. No. 08/414,751, filed Mar. 31, 1995 now abandoned.

FIELD OF THE INVENTION

The present invention relates to the field of semiconductor packaging. More specifically, the invention relates to a method for establishing a low cost electrical and mechanical connection between a surface mounted capacitor and a semiconductor package.

BACKGROUND OF THE INVENTION

Integrated circuits are typically housed within a package that is mounted to a printed circuit board (PCB). The package is designed to protect the integrated circuit (IC) device from damage, to provide adequate heat dissipation during operation, and to provide electrical connection between the IC device and a PCB (e.g., a peripheral card, a motherboard and the like). In addition, the semiconductor package often serves as a platform for mounting other electronic or electrical devices necessary for the proper operation of the IC device. For example, in order to control ringing caused by noise and a host of other electrical problems, decoupling capacitors are often mounted onto the package substrate where they are electrically coupled to the IC device. The present invention is directed at establishing a low cost electrical/mechanical connection between a surface mounted capacitor, such as a Low Inductance Capacitor Array (LICA), and a semiconductor package.

Among other features, a semiconductor package typically consist of a substrate having one or more sets of electrical contact pads positioned about one or more surfaces of the substrate for electrically coupling other electronic or electrical devices to the package. These electrical contact pads are commonly referred to as "lands." The lands typically comprise an electrically conductive material coated with a solder-wettable metallurgy. Using existing techniques, surface mounted capacitors are electrically and mechanically connected to the package by first forming a chromium layer over the electrodes of the capacitor. The chromium layer is generally referred to as a "ribbon." The ribbon is produced by forming a knife edge metal mask over the capacitor surface and then evaporating chromium onto the exposed portions of the capacitor surface. Once the chromium ribbon is formed under-bump-metallization (UBM) layers, such as chromium/copper/gold, are sequentially deposited around the electrodes of the capacitor through the holes of a metal mask using another evaporator. The UBM chromium layer acts as an adhesion promoter and a diffusion barrier metal layer which makes contact with the chromium ribbon of the capacitor. The UBM copper layer is deposited over the UBM chromium layer to promote the eventual wetting of solder onto the capacitor. In order to prevent the copper from oxidizing, a layer of gold is deposited over the copper layer. Finally, a Pb layer and a Sn layer is deposited over the UBM layers through the same mask using another evaporator. The capacitor is then placed in a hydrogen ambient furnace for reflow. During reflow the Pb and Sn layers mix to form solder bumps and are wetted onto the chromium ribbon of the capacitor. Eventually, the connection between the capacitor and semiconductor package is made by positioning the solder bumps of the capacitor over a corresponding set of lands on the package and running the unit through another reflow furnace.

Although the evaporation process is well established, costs associated with the process are high. The process requires at least three evaporators and involves the use of at least two metal masks. Furthermore, the process demands the use of a hydrogen ambient furnace to facilitate the melting of the Pb and Sn layers during reflow.

What is needed then is a low cost method for forming reliable connections between surface mounted capacitors and semiconductor packages. As will be seen, the present invention provides an improved method for establishing a low cost electrical and mechanical connection between a surface mounted capacitor and a semiconductor package.

SUMMARY OF THE INVENTION

An Improved method for electrically and mechanically coupling capacitors to semiconductor packages is disclosed.

The improved method for connecting surface mounted capacitors is accomplished primarily through the following steps: First, chromium, nickel, and gold layers are sequentially deposited onto the surface of the capacitor using a sputter deposition process. The metal layers are applied in such a way that the electrodes of the capacitor are fully covered by the resultant Cr/Ni/Au film layer. Either concurrently or at some other time Pb/Sn solder paste is applied over the semiconductor package electrical contact pads using a screen mesh apparatus and squeegee. The connection between the capacitor and the package is then made by positioning the Cr/Ni/Au film region of the capacitor over the lands of the package and running the unit through a nitrogen ambient reflow furnace. Thus, the present invention provides a method for electrically and mechanically coupling a capacitor to a semiconductor package while eliminating the high costs associated with the evaporation method.

BRIEF DESCRIPTION OF THE DRAWINGS

The present invention is illustrated by way of example and is not limited by the figures of the accompanying drawings, in which like references indicate similar elements, and in which:

FIG. 1 illustrates a top view of a capacitor having electrodes disposed about one surface of the capacitor.

FIG. 2 illustrates a side view of a typical semiconductor package with capacitors mounted on the surface of the package substrate.

FIG. 3 illustrates a side view of a capacitor in one embodiment of the present invention before metal layers are deposited over the electrodes of a capacitor.

FIG. 4 represents the capacitor illustrated in FIG. 3 after metal layers have been deposited over the electrodes of the capacitor.

FIG. 5 represents a top view of the capacitor illustrated in FIG. 4.

FIG. 6 illustrates the semiconductor package, electrical contact pad, and screen mesh apparatus configuration of one embodiment of the present invention before solder paste is applied over the electrical contact pads.

FIG. 7 represents the semiconductor package illustrated in FIG. 6 after solder paste is applied over the electrical contact pads.

FIG. 8 illustrates the capacitor and package substrate configuration of one embodiment of the present invention prior to reflow.

FIG. 9 illustrates a flow chart of one embodiment of the present invention.

DETAILED DESCRIPTION

A method for electrically and mechanically coupling an electrical device to a semiconductor package is described. In the following description, numerous specific details are set forth such as material types, dimensions, processing steps, etc., in order to provide a thorough understanding of the present invention. However, it will be apparent to one of skill in the art that the invention may be practiced without these specific details. In other instances, well known elements and processing techniques have not been shown in particular detail in order to avoid unnecessarily obscuring the present invention.

FIG. 1 illustrates a capacitor 10 having electrodes 12 disposed about one of its surfaces. Capacitor 10 typically consist of a combination of metal and ceramic layers with all metal layers being electrically isolated by the ceramic layers. Electrodes 12 are provided at the ceramic surface 11 of capacitor 10 for electrically coupling the capacitor to other electrical or electronic devices.

As previously discussed, decoupling capacitors are often mounted onto the substrate of a semiconductor package where they are electrically coupled to an IC device. FIG. 2 illustrates a side view of a typical semiconductor package 24 having capacitors 10 mounted on package substrate 26. Package substrate 26 contains electrical interconnects (not shown) that electrically couple the IC device 30 to electrical contact pads located on the surface of the substrate. Package substrate 26 is made of any temperature resistant material, such as alumina oxide, high temperature PCB, etc. in order to prevent the substrate from melting during normal reflow conditions. The electrical contact pads are comprised of an electrically conductive material, such as, for example, gold plated nickel.

As mentioned earlier, practitioners have used a process that depends predominately upon the use of evaporators to form the metallurgy necessary for electrically and mechanically coupling a surface mounted capacitor to a package. However, the costs associated with the evaporation process are high. To reduce manufacturing costs the present invention uses a multiple target, sputter deposition chamber to form a metal coating over the electrodes of the capacitor. Further cost savings are realized by eliminating the existing method of evaporating separate Pb and Sn layers onto the UBM layers of the capacitor. In lieu of using the evaporation process of prior art methods, the present invention utilizes a method wherein solder is screen printed directly onto the electrical contact pads of the package substrate. The coupling of the capacitor and the package substrate is made by positioning the metal coated regions of the capacitor over the electrical contact pads of the package substrate and running the unit through a reflow furnace. During reflow the solder is wetted onto the electrical contact pads of the package substrate and onto the adjoining metal layers of the capacitor.

FIG. 3 shows a side view of capacitor 10 before metal layers are deposited over electrodes 12. As depicted in FIG. 4 and 5, metal layers 16, 17 and 18 are formed over the surface 11 of capacitor 10 such that all the electrodes in a given row are electrically connected. In one embodiment of the invention metal layers 16, 17 and 18 comprise chromium, nickel and gold, respectively. The metal layers are formed by placing the capacitor within a multiple target, sputter deposition chamber wherein metal layers 16, 17 and 18 are sequential deposited over surface 11 and electrode 12 through the holes of a mask. In one embodiment chromium layer 16, nickel layer 17 and gold layer 18 have thicknesses of approximately 0.43, 0.5, 0.05 microns, respectively.

Either concurrent with the formation of metal layers 16, 17 and 18, or at some other time, solder paste is applied over electrical contact pads 28 of package substrate 26. (See FIG. 6.) Pb/Sn solder paste is applied to contact pads 28 by first positioning a screen mesh apparatus 30 over package substrate 26 such that mesh openings 32 are aligned with electrical contact pads 28. When the screen mesh apparatus is in place, solder paste is dispensed onto the top surface 31 of apparatus 30 and then forced through mesh openings 32 onto contact pads 28 by the use of a squeegee or some other device. FIG. 7 shows a cross-sectional view of the substrate 26, after solder 36 has been applied to electrical contact pads 28.

The connection between capacitor 10 and package substrate 26 is accomplished by positioning the metal coated regions of capacitor 10 over electrical contact pads 28 of package substrate 26, as illustrated in FIG. 8, and running the unit through a nitrogen ambient reflow furnace. The reflow furnace temperature is adjusted above the melting temperature of solder 36 such that during reflow solder 36 is wetted onto electrical contact pads 28 and the Cr/Ni/Au metal layers 19 of capacitor 10.

FIG. 9 illustrates a flow chart of the coupling process in one embodiment of the present invention.

Solder 36 may comprise any solder material composition whose properties are conducive to the manufacturing process just described. In one embodiment of the present invention solder 36 comprises a 97/3 Pb/Sn solder paste composition that contains a resin flux. In this embodiment the reflow furnace temperature is set at approximately 350 degrees Celsius. The diameter and thickness of solder 36 will vary depending upon the particular application. Generally, the diameter of solder 36 will be approximately equal to the diameter of electrical contact pad 28. The thickness of solder 36 will typically vary between 0.005 to 0.006 inches. Note also that a solder paste not containing a flux may be used, however, in this instance it may be necessary to coat electrical contact pads 28 with a flux before applying solder 36 to the pads. It is further understood that any of a variety of methods may be used to apply solder 36 to electrical contact pads 28. For example, in lieu of using the screen mesh apparatus described, an extrusion method of applying solder paste 36 may be utilized.

In the foregoing description an embodiment of the present invention is disclosed having metal layers 16, 17 and 18 comprising chromium, nickel and gold, respectively. It should be understood, however, that this combination of metal layers is not essential to the implementation of the present invention, nor is the invention limited to three metal layers. The implementation of the present invention requires only the use of an electrically conductive metal layer or metal stack that bonds to electrodes 12 and surface 11 of capacitor 10 and is wettable with solder 36. As an example, metal layer 16 may comprise titanium or titanium tungsten and metal layer 17 may comprise copper. Note, also that in another embodiment metal layers 16, 17 and 18 are deposited over the surface and electrodes of capacitor 10 using an evaporation process rather than a sputter deposition process.

It is appreciated that the methods and apparatus of the present invention may be used in other technologies to form electrical and/or mechanical connections between other types of electrical devices. It is further understood that the relative dimensions, geometric shapes, materials and process parameters set forth within the specification are exemplary of the disclosed embodiments only. Other embodiments may utilize different dimensions, shapes, materials, and process settings, etc., to achieve substantially the same results.

What is claimed is:

1. A method of electrically coupling an electrical device to a package substrate, said method comprising the steps of:
    a) sputter depositing a metal coating onto an electrode of said electrical device;
    b) depositing solder paste onto an electrical contact pad of said package substrate;
    c) positioning said metal coating of said electrical device adjacent to said solder paste of said package substrate;
    d) heating said solder paste and said metal coating in an inert gas atmosphere such that said solder paste is wetted onto said electrical contact pad and said metal coating.

2. The method of claim 1 wherein said metal coating comprises multiple metal layers.

3. The method of claim 2 wherein the thickness of said metal coating is less than 1 micron.

4. The method of claim 2 wherein said multiple metal layers comprise chromium, nickel, and gold layers.

5. The method of claim 4 wherein the thickness of said metal coating is less than 1 micron.

6. The method of claim 4 wherein the thickness of said gold layer is less than or equal to 0.05 microns.

7. The method of claim 1 wherein said solder paste comprises 97/3 Pb/Sn.

8. The method of claim 7 wherein said heating step is performed at a temperature of approximately 350° C.

9. A method of coupling an electrical device to a package, said method comprising the steps of:
    a) sputter depositing a metal coating over an electrode of said electrical device;
    b) applying solder paste to an electrical contact pad of said package by forcing said solder paste through a screen mesh onto said electrical contact pad;
    c) positioning said metal coating of said electrical device adjacent to said solder paste of said package;
    d) heating said solder paste and said metal coating in an inert gas atmosphere such that said solder paste is wetted onto said electrical contact pads and said metal coating.

10. The method of claim 9 wherein said metal coating comprises multiple metal layers.

11. The method of claim 10 wherein the thickness of said metal coating is less than 1 micron.

12. The method of claim 10 wherein said multiple metal layers comprise chromium, nickel, and gold layers.

13. The method of claim 9 wherein the thickness of said metal coating is less than 1 micron.

14. The method of claim 9 wherein the thickness of said gold layer is less than or equal to 0.05 microns.

15. The method of claim 9 wherein said solder paste comprises 97/3 Pb/Sn.

16. The method of claim 15 wherein said heating step is performed at a temperature of approximately 350° C.

17. A method of electrically and mechanically coupling an electrical device to a package, said method comprising the steps of:
    a) sputter depositing a metal coating over the electrodes of said electrical device;
    b) applying solder paste onto the electrical contact pads of said package by positioning a screen mesh apparatus over said package such that the screen mesh regions of said screen mesh apparatus are located over said electrical contact pads;
    c) forcing said solder paste through said screen mesh regions onto said electrical contact pads;
    d) positioning said metal coating of said electrical device adjacent to said solder paste of said package;
    e) heating said solder paste and said metal coating in an inert gas atmosphere such that said solder paste is wetted onto said electrical contact pads and said metal coating.

18. The method of claim 17 wherein said metal coating comprises multiple metal layers.

19. The method of claim 18 wherein the thickness of said metal coating is less than 1 micron.

20. The method of claim 18 wherein said multiple metal layers comprise chromium, nickel, and gold layers.

21. The method of claim 20 wherein the thickness of said metal coating is less than 1 micron.

22. The method of claim 20 wherein the thickness of said gold layer is less than or equal to 0.05 microns.

23. The method of claim 17 wherein said solder paste comprises 97/3 Pb/Sn.

24. The method of claim 17 wherein said heating step is performed at a temperature of approximately 350° C.

25. A method of electrically coupling a capacitor to a package substrate, said method comprising the steps of:
    a) sputter depositing a metal coating onto a plurality of electrodes of said capacitor;
    b) depositing solder paste onto at least one electrical contact pad of said package substrate;
    c) positioning said metal coating of said capacitor adjacent to said solder paste of said package substrate;
    d) heating said solder paste and said metal coating in an inert gas atmosphere such that said solder paste is wetted onto said electrical contact pad and said metal coating.

26. The method of claim 25 wherein said metal coating comprises multiple metal layers.

27. The method of claim 26 wherein the thickness of said metal coating is less than 1 micron.

28. The method of claim 26 wherein said multiple metal layers comprise chromium, nickel, and gold layers.

29. The method of claim 28 wherein the thickness of said metal coating is less than 1 micron.

30. The method of claim 28 wherein the thickness of said gold layer is less than or equal to 0.05 microns.

31. The method of claim 25 wherein said solder paste comprises 97/3 Pb/Sn.

32. The method of claim 31 wherein said heating step is performed at a temperature of approximately 350° C.

* * * * *

UNITED STATES PATENT AND TRADEMARK OFFICE
CERTIFICATE OF CORRECTION

PATENT NO.    : 5,842,626
DATED         : December 1, 1998
INVENTOR(S)   : Bhansali et al.

It is certified that error appears in the above-identified patent and that said Letters Patent is hereby corrected as shown below:

Column 5,
Lines 54 and 56, delete "claim 9" and insert -- claim 12 --.

Signed and Sealed this

Fifth Day of August, 2003

JAMES E. ROGAN
*Director of the United States Patent and Trademark Office*